US009425320B2

(12) United States Patent
Choong et al.

(10) Patent No.: US 9,425,320 B2
(45) Date of Patent: *Aug. 23, 2016

(54) THIN FILM TRANSISTOR ON FIBER AND MANUFACTURING METHOD OF THE SAME

(71) Applicant: SAMSUNG ELECTRONICS CO., LTD., Suwon-si (KR)

(72) Inventors: Chwee Iin Choong, Suwon-si (KR); Sang-won Kim, Seoul (KR); Jong-jin Park, Hwaseong-si (KR); Ji-hyun Bae, Seoul (KR); Jung-kyun Im, Yongin-si (KR); Sang-hun Jeon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/189,494

(22) Filed: Feb. 25, 2014

(65) Prior Publication Data

US 2014/0239357 A1 Aug. 28, 2014

(30) Foreign Application Priority Data

Feb. 25, 2013 (KR) .................. 10-2013-0020014

(51) Int. Cl.
*H01L 29/76* (2006.01)
*H01L 29/786* (2006.01)
*H01L 29/66* (2006.01)
*H01L 51/05* (2006.01)
*H01L 29/06* (2006.01)

(52) U.S. Cl.
CPC ... *H01L 29/78603* (2013.01); *H01L 29/66742* (2013.01); *H01L 51/0558* (2013.01); *H01L 29/0669* (2013.01)

(58) Field of Classification Search
CPC .................. H01L 29/78603; H01L 51/0558; H01L 29/66742; H01L 29/0669
See application file for complete search history.

(56) References Cited

U.S. PATENT DOCUMENTS

| 6,262,355 | B1 | 7/2001 | Koch |
| 6,420,640 | B2 | 7/2002 | Koch |
| 6,961,227 | B1 | 11/2005 | Whiton et al. |
| 7,388,166 | B2 | 6/2008 | Marmaropoulos et al. |
| 7,557,367 | B2 | 7/2009 | Rogers et al. |
| 8,198,621 | B2 | 6/2012 | Rogers et al. |
| 8,679,905 | B2 * | 3/2014 | Shieh et al. ............... 438/162 |
| 2006/0257074 | A1 * | 11/2006 | Suzuki et al. ............. 385/49 |
| 2009/0053950 | A1 * | 2/2009 | Surve ...................... 442/181 |

(Continued)

FOREIGN PATENT DOCUMENTS

KR 10-2010-0123755 A 11/2010
WO 2008/030960 A2 3/2008

OTHER PUBLICATIONS

Anonymous, "Gesture recognition", Wikipedia, the free encyclopedia, Jul. 16, 2015, 8 total pages, retrieved from <https://en.wikipedia.org/wiki/Gesture_recognition>.

*Primary Examiner* — Jarrett Stark
(74) *Attorney, Agent, or Firm* — Sughrue Mion, PLLC

(57) ABSTRACT

Provided is a thin film transistor on fiber and a method of manufacturing the same. The thin film transistor includes a fiber; a first electrode, a second electrode and a gate electrode formed on fiber; a channel formed between the first and second electrodes; an encapsulant encapsulating the fiber, the first, second, and gate electrodes, and an upper surface of the channel; and a gate insulating layer formed in a portion of the inner area of the encapsulant.

13 Claims, 4 Drawing Sheets

(56) References Cited

U.S. PATENT DOCUMENTS

| | | |
|---|---|---|
| 2009/0295366 A1 | 12/2009 | Cehelnik |
| 2010/0051913 A1* | 3/2010 | Takeya et al. .................. 257/40 |
| 2010/0237336 A1* | 9/2010 | Rinzler et al. .................. 257/40 |
| 2010/0259472 A1 | 10/2010 | Radivojevic et al. |
| 2012/0220053 A1* | 8/2012 | Lee et al. ....................... 436/501 |
| 2013/0140531 A1* | 6/2013 | Park et al. ....................... 257/40 |
| 2013/0168657 A1* | 7/2013 | Choong et al. .................. 257/40 |
| 2014/0160628 A1* | 6/2014 | Doyle et al. .................. 361/324 |
| 2014/0239357 A1* | 8/2014 | Choong et al. ............... 257/288 |

* cited by examiner

THIN FILM TRANSISTOR ON FIBER AND MANUFACTURING METHOD OF THE SAME

CROSS-REFERENCE TO RELATED APPLICATION

This application claims the benefit of Korean Patent Application No. 10-2013-0020014, filed on Feb. 25, 2013, in the Korean Intellectual Property Office, the disclosure of which is incorporated herein in its entirety by reference.

BACKGROUND

1. Field

The present disclosure relates to methods and apparatuses for a thin film transistor, and more particularly, to a thin film transistor on fiber and a method of manufacturing the same.

2. Description of the Related Art

As application fields of electronic devices expand, demands are rising for electronic devices with structures that may overcome the limitations of currently known electronic devices formed on substrates such as silicon (Si) and glass.

Thin film transistors are used for areas such as flexible displays, smart clothes, dielectric elastomer actuators (DEA), biocompatible electrodes, and sensing electrical signals in a living body. The thin film transistors may have various characteristics according to the purpose of use. For example, electronic devices formed on textiles such as gloves, clothes or hats, may be designed to have a flexible and foldable structure, and a characteristic which changes depending on the movement of a living body

SUMMARY

Provided are thin film transistors on fiber.

Provided are methods of manufacturing the thin film transistors on fiber.

Additional aspects will be set forth in part in the description which follows and, in part, will be apparent from the description, or may be learned by practice of the presented embodiments.

According to an aspect of the exemplary embodiments, a thin film transistor on fiber includes a first electrode, a second electrode, and a gate electrode, all formed on the fiber; a channel formed between the first and second electrodes; an encapsulant encapsulating the fiber, the first, second and gate electrodes, and the upper surface of the channel; and a gate insulating layer formed in a portion of the inner area of the encapsulant.

The gate insulating layer may be formed in liquid phase, and may be in a non-contact status with at least one of the first, second and gate electrodes.

The gate insulating layer may be formed including ionic liquids.

The gate insulating layer may further include a lubricant.

The gate insulating layer may be formed using a material having a coefficient of friction of about 0.1 or less.

The fiber may be formed using a natural fiber, a chemical fiber, or a combination thereof.

The channel may be formed using a semiconductor thin film formed with an organic semiconductor material, or a fibrous nano-structured material.

The encapsulant may be formed on a fiber which is formed using a resin or a molding material.

The resin may be a thermally curable or UV curable acrylic resin, a thermally curable epoxy resin, or an elastomer resin.

According to another aspect of the exemplary embodiments, a method of manufacturing a thin film transistor on fiber includes coating a conductive material and patterning the same to form a first electrode, a second electrode, and a gate electrode; forming a channel between the first and second electrodes; and coupling the fiber, in which the first, second and gate electrodes, and the channel have been all formed thereon, with an encapsulant containing a gate insulating layer The foregoing general description and the following detailed description are only exemplary and explanatory and they are intended to provide further explanation of the invention as claimed.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
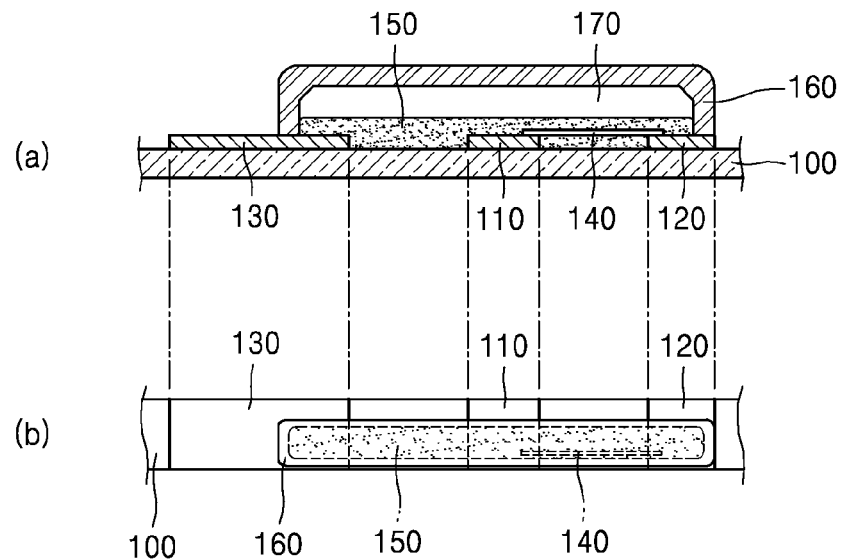
FIGS. 1(a), and 1(b) are a cross-sectional view and a plan view respectively illustrating the structure of a thin film transistor on fiber according to an exemplary embodiment t.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list. It will be understood that for the purposes of this disclosure, "at least one of X, Y, and Z" can be construed as X only, Y only, Z only, or any combination of two or more items X, Y, and Z (e.g., XYZ, XZ, XYY, YZ, ZZ).

The terminology used herein is for the purpose of describing particular embodiments only and is not intended to be limiting of the present disclosure. Although some features may be described with respect to individual exemplary embodiments, aspects need not be limited thereto such that features from one or more exemplary embodiments may be combinable with other features from one or more exemplary embodiments.

Hereinafter, a thin film transistor on fiber according to an exemplary embodiment will be described in detail. In the drawings, the thicknesses of layers and regions are exaggerated for clarity.

FIGS. 1(a) and 1(b) are a cross-sectional view and a plan view according to an exemplary embodiment. FIG. 1(a) is the cross-sectional view, and FIG. 1(b) is the plan view.

Referring to FIGS. 1(a) and 1(b), a thin film transistor on fiber according to the present embodiment may include a fiber 100, and first electrode 110, a second electrode 120, and a gate electrode 130 that are formed on the fiber 100. The first, second and gate electrodes 110, 120 and 130 may be formed spaced apart from each other, and the first and second electrodes 110 and 120 may respectively be a source and a drain, or vice versa. A channel 140 may be formed between the first and second electrodes 110 and 120. An encapsulant 160 may be formed, encapsulating the fiber 100, the first, second and gate electrodes 110, 120 and 130, and the upper surface of the channel 140. A gate insulating layer 150 may be formed on the fiber 100, the first, second and gate electrodes 110, 120 and 130, and the channel 140, in an encapsulating zone 170 encapsulated by the encapsulant 160.

The gate insulating layer 150 may be formed in liquid phase. The gate insulating layer 150 may be formed not in the entire area, but in a portion of the encapsulating zone 170 encapsulated by the encapsulant 160, and may include an empty space. The gate insulating layer 150 may be formed up to a height at which the gate insulating layer 150 may contact the first, second and gate electrodes 110, 120 and 130, and the channel 140, all of which are formed on fiber 100. For example, the gate insulating layer 150 may be formed up to a height at which the first and second electrodes 110 and 120 are formed in the encapsulating zone 170. In this state, the gate insulating layer 150 may contact the lower surface of the channel 140 formed on the first and second electrodes 110 and 120.

Figure 2:
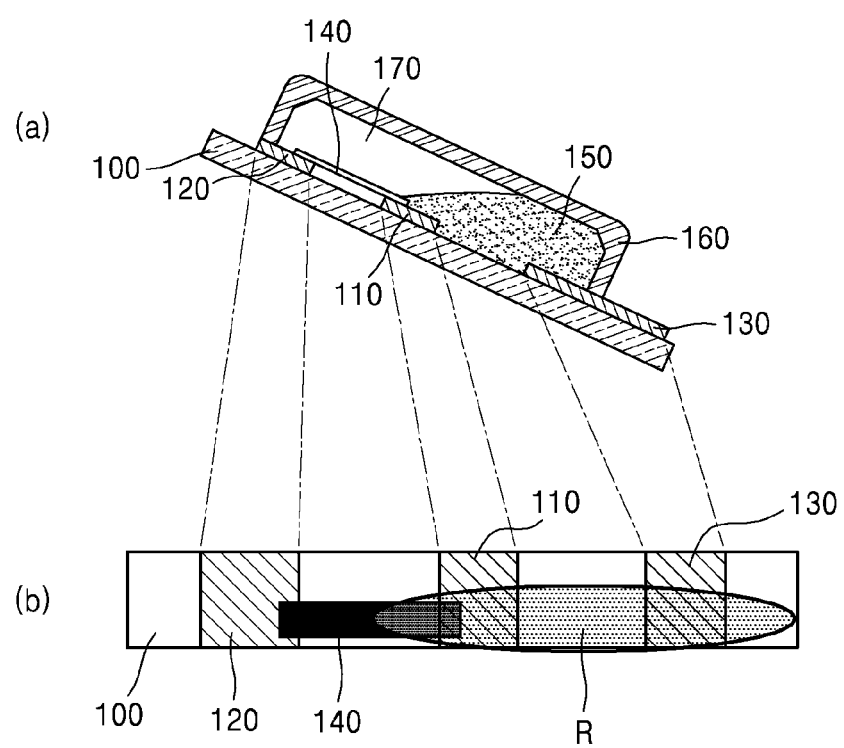
FIGS. 2(a) and 2(b) are a cross-sectional view and a plan view respectively illustrating a tilted thin film transistor on fiber according to an embodiment of the present inventive concept.

Referring to FIGS. 1(a), 1(b), 2(a) and 2(b), the driving principle of a thin film transistor on fiber will be described in detail. FIGS. 2(a) and 2(b) respectively are a cross-sectional view and a plan view of a tilted thin film transistor on fiber according to another exemplary embodiment.

As in FIGS. 1(a) and 1(b), in the case that the power is applied to the first, second and gate electrodes 110, 120 and 130, at a state where a gate insulating layer 150 contacts a first electrode 110, a second electrode 120, and a gate electrode 130, electrons may move through a channel 140 between the first and second electrodes 110 and 120, and thus the thin film transistor may become "ON" status. Also, as power is applied to the first, second and gate electrodes 110, 120 and 130, the fiber 100 may be tilted such that the gate insulating layer 150 is in non-contact status with at least one of the first, second and gate electrodes 110, 120 and 130 as in FIGS. 2(a) and 2(b). In this state, the movement of electrons through the channel 140 between the first and second electrodes 110 and 120 is stopped and, as a result, the thin film transistor switches to "OFF" status. The thin film transistor formed on fiber according to the exemplary embodiment, may be applied on hats, gloves, clothes, or the like. Depending on the intentional or unintentional movements of a user, the thin film transistor may easily be changed into "ON" and "OFF" status.

Hereinafter, materials of each layer of a thin film transistor on fiber according to the exemplary embodiment will be described. The thin film transistor according to the present embodiment may be a thin film transistor formed on various clothing including hats and gloves.

A fiber 100 may be a substrate, and may include a flexible natural fiber, a chemical fiber, or a combination thereof. Also, the fiber 100 may be a material having excellent smoothness, waterproof ability, tensile strength, and folding ability. Here, a natural fiber may be generated from wood pulp, linen, ramie, hemp, or wool; and a chemical fiber may be generated from vinylon, nylon, acrylic, rayon, polypropylene, or asbestos fibers. In addition, the fiber 100 may be formed with a single fiber, and a cross-section of the fiber 100 may be in various shapes of polygons such as circles, ovals, and tetragons. The length of the fiber 100 may be more than several times or several tens of time, for example, 100 to 1000 times longer than the width of a cross-section thereof.

A first electrode 110, a second electrode 120, and gate electrode 130 may be formed using a conductive material that may be used as electrodes of semiconductor devices, and may be formed using a material with low surface energy, for example, metals, conductive metallic oxides, conductive metallic nitrides, or conductive polymers. Here, metals may include aluminum (Al), gold (Au), silver (Ag), chrome (Cr), titanium (Ti), copper (Cu), tantalum (Ta), molybdenum (Mo), tungsten (W), nickel (Ni), palladium (Pd), platinum (Pt), or an alloy of metals described above; however, metals are not limited thereto. Conductive metal oxides may include indium tin oxide (ITO) or indium zinc oxide (IZO). Also, conductive polymers may be polyethylene dioxythiophene-polystyrene sulphonate (PEDOT-PSS), polyaniline, polypyrrole, or a combination thereof.

A channel 140 may be formed using a semiconductor thin film formed with an organic semiconductor material, or a fibrous nano-structured material. Here, the nano-structured material may be in forms such as nano rods or nano wires; however, the form is not limited thereto. For example, a one-dimensional cross-section of the nano-structured material may be in shapes such as circles or polygons. Also, organic semiconductor material may include polythiophene, polyacetylene, polypyrrole, polyphenylene, polythienyl vinylidene, polyphenylene sulfide, polyaniline, polyparaphenylene vinylene, polyparaphenylene, polyfluorene, or polythiovinylene.

A gate insulating layer 150, formed in liquid phase, may be formed using electrolytes such as ionic liquids, and resin composites. Ionic liquids and resin composites may be dielectric, flexible and highly adhesive to base materials.

An ionic liquid is a salt in a liquid state, formed with cations and anions. For example, cations of ionic liquids may be imidazolium, pyrazolium, triazolium, thiazolium, oxazolium, pyridazinium, pyrimidinium, pyrazinium, ammonium, phosphonium, guanidinium, uranium, thiouronium, pyridinium, pyrroldinium, or a combination thereof. Also, anions of ionic liquids may be halide, borate-based anions, phosphate-based anions, phosphinate-based anions, imide-based anions, sulfonate-based anions, acetate-based anions, sulphate-based anions, cyanate-based anions, thiocyanate-based anions, carbon-based anions, complex-based anions, or C104-anions.

Ionic liquids may further include additives such as a lubricant; for example, carboxylic acid derivatives, or per-deuteriododecanoic acid (d-12CA, C11D12COOH). Additives may increase flexibility of the gate insulating layer 150. The gate insulating layer 150 may be formed of materials having a coefficient of friction of about 0.1 or less.

An encapsulant 160 may encapsulate materials of the gate insulating layer 150, and may be formed using resin or molding materials. For example, resin may be a thermally curable or UV curable acrylic resin, a thermally curable epoxy resin, or an elastomer resin. Also, resin may include poly(ethylene glycol) diacrylate, trimethylolpropane triacrylate, or dipentaerythiritol hexa acrylate.

Hereinafter, a method of manufacturing a thin film transistor on fiber according to an exemplary embodiment will be described with reference to the accompanying drawings. FIGS. 3A through 3E are diagrams illustrating a method of manufacturing the thin film transistor on fiber according to the exemplary embodiment.

Figure 3A:
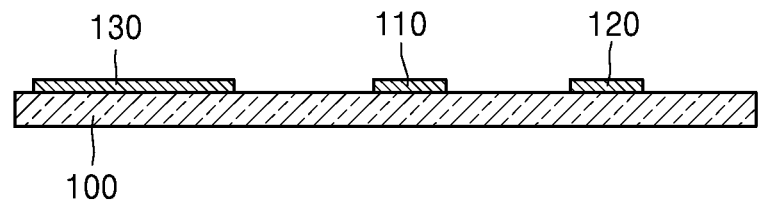
FIGS. 3A through 3E are diagrams illustrating a method of manufacturing the thin film transistor on fiber according to an exemplary embodiment.

Referring to FIG. 3A, first, a conductive material is applied on fiber 100, to thus, a conductive material layer is formed. The conductive material layer is patterned, and a first electrode 110, a second electrode 120, and a gate electrode 130 are formed thereon. The first, second, and gate electrodes 110, 120 and 130 may be formed using identical or different materials. Here, the fiber 100 may be formed using a natural fiber, a chemical fiber, or a combination thereof. The fiber 100 may be a fiber in which the length thereof is far longer than the width thereof. Also, a thin film transistor may be formed onto a single strand or multiple strands of the fiber 100. A conductive material may be formed using metals, conductive metal oxides, or conductive polymers. The conductive material layer may be deposited using a physical vapor deposition method, or a chemical vapor deposition method; however, usable methods are not limited thereto.

Figure 3B:
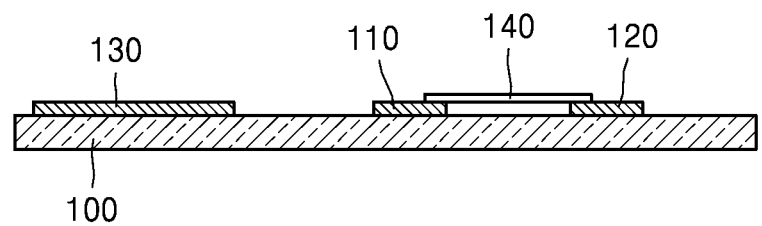

Referring to FIG. 3B, a channel 140 is formed between the first electrode 110 and the second electrode 120. The channel 140 may be formed using a semiconductor thin film formed with an organic semiconductor material, or a fibrous nano-structured material. Materials such as polythiophene, polyacetylene, polypyrrole, polyphenylene, polythienyl vinylidene, polyphenylene sulfide, polyaniline, polyparaphenylene vinylene, polyparaphenylene, polyfluorene, or polythiovinylene may be used as organic semiconductors. For example, by using electrospinning method, nano-fibers of poly(3-hexylthiophene) (P3HT) may be formed to be used as organic semiconductors.

Figure 3C:
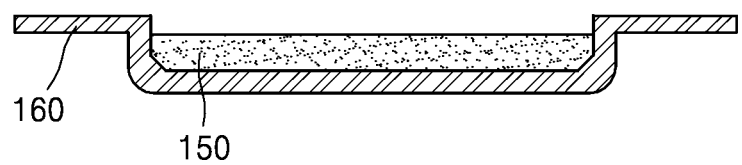

Referring to FIG. 3C, a desired amount of a material forming a gate insulating layer 150 is provided in an encapsulant 160. Here, the material of the gate insulating layer 150 is in liquid phase; the encapsulant 160 may be formed in materials that prevent the material of the gate insulating layer 150 from leaking outside the encapsulant 160. The encapsulant 160 may be formed using resin or molding materials. For example, resin may be a thermally curable and UV curable acryl-based resin, thermally curable epoxy resin, or an elastomer resin. Also, resin may be formed using poly(ethylene glycol) diacrylate, trimethylolpropane triacrylate, or dipentaerythritol hexa acrylate.

Figure 3D:
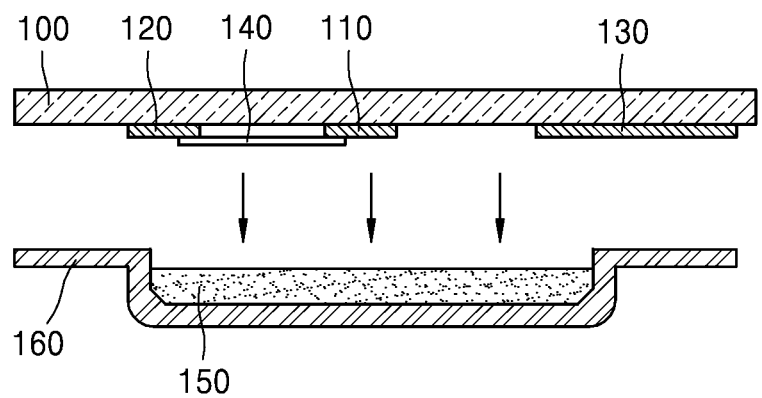
Figure 3E:
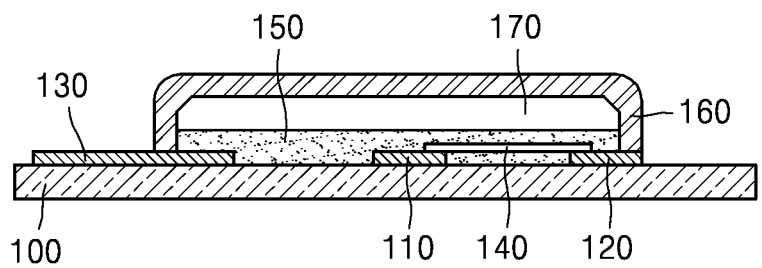

Referring to FIG. 3D, a fiber in which a first electrode 110, a second electrode 120, a gate electrode 130 and a channel 140 are formed thereon, is coupled to an encapsulant 160 containing a material forming a gate insulating layer 150. Following the methods described above, as illustrated in FIG. 3E, a thin film transistor on fiber according to an exemplary embodiment may be manufactured.

Figure 4:
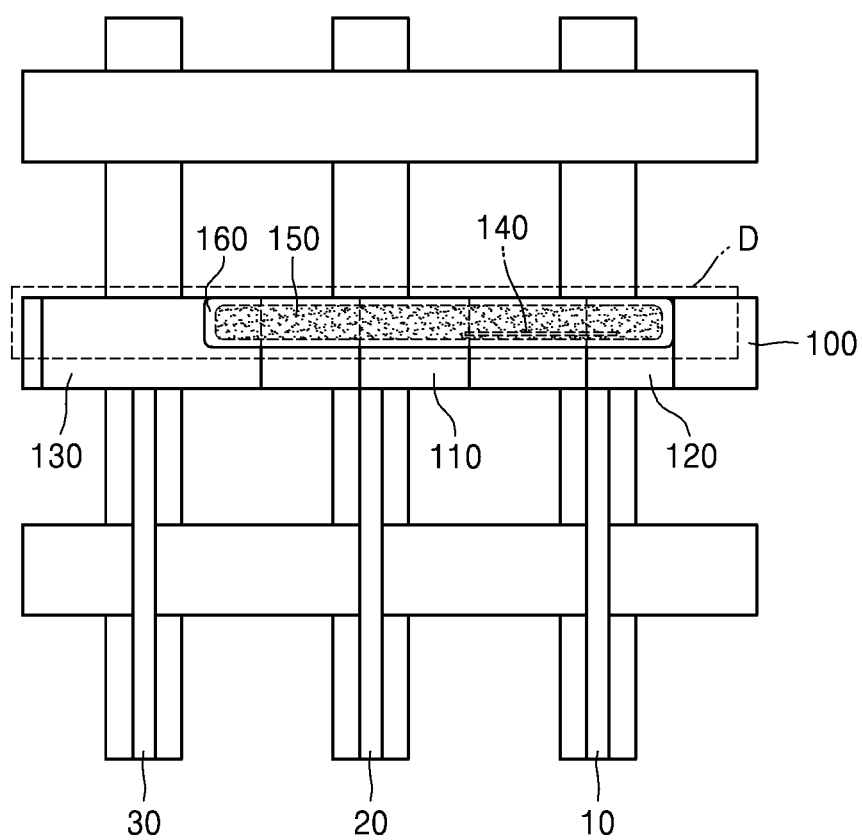
FIG. 4 is a plan view of the structure of the thin film transistor on fiber according to an exemplary embodiment.

FIG. 4 is a plan view of a thin film transistor formed on one fiber among a plurality of fibers. Referring to FIG. 4, on an area D of a fiber 100 among the plurality of fibers, a first electrode 110, a second electrode 120, and a gate electrode 130 are formed, and a channel 140 is formed on the first and second electrodes 110 and 120. Also, a gate insulating layer 150 is formed on the fiber 100 and the first, second, and gate electrodes 110, 120 and 130, and is encapsulated by an encapsulant 160. In addition, a first electrode bus line 10, a second electrode bus line 20, and a gate electrode bus line 30, which are outer bus lines, may be electrically connected to the first, second, and gate electrodes 110, 120 and 130, respectively.

As described above, according to the one or more of the above exemplary embodiments, there is provided a thin film transistor which is formed on fiber, and may operate according to intentional or unintentional tilting movements by a user. Also, according to another exemplary embodiment, there is provided a method of manufacturing a thin film transistor on a fiber.

It should be understood that the exemplary embodiments described therein should be considered in a descriptive sense only and not for purposes of limitation. Descriptions of features or aspects within each embodiment should typically be considered as available for other similar features or aspects in other embodiments.

In addition, many modifications can be made to adapt a particular situation or material to the teachings of the present disclosure without departing from the essential scope thereof. Therefore, it is intended that the present disclosure not be limited to the particular exemplary embodiments disclosed as the best mode contemplated for carrying out the present disclosure, but that the present disclosure will include all embodiments falling within the scope of the appended claims.

What is claimed is:

1. A thin film transistor formed on a fiber, the thin film transistor comprising:
   a first electrode, a second electrode, and a gate electrode, the first, the second, and the gate electrodes being formed on the fiber;
   a channel formed between the first electrode and the second electrode;
   an encapsulant encapsulating the fiber, the first electrode, the second electrode, the gate electrode and an upper surface of the channel; and
   a gate insulating layer formed in a portion of an inner area of the encapsulant,
   wherein the gate insulating layer is not formed in an entire area of an encapsulating zone encapsulated by the encapsulant, but is only formed in a portion of the encapsulating zone encapsulated by the encapsulant, and
   the encapsulating zone includes an empty space.

2. The thin film transistor according to claim 1, wherein the gate insulating layer is in liquid phase, and the gate insulating layer is in non-contact status with at least one of the first electrode, the second electrode, and the gate electrode.

3. The thin film transistor according to claim 1, wherein the gate insulating layer comprises ionic liquids.

4. The thin film transistor according to claim 3, wherein the gate insulating layer further comprises a lubricant.

5. The thin film transistor according to claim 3, wherein the gate insulating layer comprises a material having a coefficient of friction of 0.1 or less.

6. The thin film transistor according to claim 1, wherein the fiber comprises a natural fiber, a chemical fiber, or a combination of a natural fiber and a chemical fiber.

7. The thin film transistor according to claim 1, wherein the channel comprises a semi-conductor thin film, the semiconductor thin film further comprising an organic semiconductor material or a fibrous nano-structured material.

8. The thin film transistor according to claim 1, wherein the encapsulant comprises a resin or a molding material.

9. The thin film transistor according to claim 8, wherein the resin is a thermally curable or UV curable acrylic resin, a thermally curable epoxy resin, or an elastomer resin.

10. A method of manufacturing a thin film transistor disposed on a fiber, the method comprising:
    forming a conductive material on the fiber;
    patterning the conductive material to form a first electrode, a second electrode, and a gate electrode;

forming a channel between the first electrode and the second electrode; and encapsulating the fiber, the first electrode, the second electrode, the gate electrode, and the channel in an encapsulant, wherein the encapsulant comprises a gate insulating layer, the gate insulating layer is not formed in an entire area of an encapsulating zone encapsulated by the encapsulant, but is only formed in a portion of the encapsulating zone encapsulated by the encapsulant, and the encapsulating zone includes an empty space.

11. The manufacturing method of claim 10, wherein the gate insulating layer comprises ionic liquids.

12. The manufacturing method of claim 11, wherein the gate insulating layer further comprises a lubricant.

13. The manufacturing method of claim 10, wherein the gate insulating layer is a material having a coefficient of friction of 0.1 or less.

\* \* \* \* \*